United States Patent
Lin

(10) Patent No.: US 10,269,802 B2
(45) Date of Patent: Apr. 23, 2019

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventor: Chih-Han Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/714,231

(22) Filed: May 15, 2015

(65) Prior Publication Data

US 2016/0336320 A1    Nov. 17, 2016

(51) Int. Cl.
  *H01L 29/772*        (2006.01)
  *H01L 27/092*        (2006.01)
  (Continued)

(52) U.S. Cl.
  CPC .. *H01L 27/0924* (2013.01); *H01L 21/823431* (2013.01); *H01L 21/823481* (2013.01);
  (Continued)

(58) Field of Classification Search
  CPC ......... H01L 29/66795; H01L 29/42372; H01L 29/42376; H01L 29/4238; H01L 29/7853;
  (Continued)

(56) References Cited

U.S. PATENT DOCUMENTS

| 7,977,174 B2 | 7/2011 | Luning et al. |
| 9,331,074 B1 | 5/2016 | Chang et al. |

(Continued)

FOREIGN PATENT DOCUMENTS

| CN | 105845578 A | 8/2016 |
| KR | 10-2012-0012454 A | 2/2012 |

(Continued)

OTHER PUBLICATIONS

Final Rejection dated Jul. 14, 2017 issued in Korean Patent Application No. 10-2015-0166554.
(Continued)

*Primary Examiner* — Steven H Loke
*Assistant Examiner* — Scott Stowe
(74) *Attorney, Agent, or Firm* — McDermott Will & Emery LLP

(57) ABSTRACT

A semiconductor device includes first and second Fin FETs and a separation plug made of an insulating material and disposed between the first and second Fin FETs. The first Fin FET includes a first fin structure extending in a first direction, a first gate dielectric formed over the first fin structure and a first gate electrode formed over the first gate dielectric and extending in a second direction perpendicular to the first direction. The second Fin FET includes a second fin structure, a second gate dielectric formed over the second fin structure and a second gate electrode formed over the first gate dielectric and extending in the second direction. When viewed from above, an end shape the separation plug has a concave curved shape, while an end of the first gate electrode abutting the separation plug has a convex curved shape.

20 Claims, 11 Drawing Sheets

(51) Int. Cl.
*H01L 27/088* (2006.01)
*H01L 29/49* (2006.01)
*H01L 29/66* (2006.01)
*H01L 21/8234* (2006.01)
*H01L 21/8238* (2006.01)
*H01L 21/3213* (2006.01)

(52) U.S. Cl.
CPC ........... *H01L 21/823821* (2013.01); *H01L 21/823878* (2013.01); *H01L 27/0886* (2013.01); *H01L 29/495* (2013.01); *H01L 29/4966* (2013.01); *H01L 29/66545* (2013.01); *H01L 21/32137* (2013.01); *H01L 21/82345* (2013.01); *H01L 21/823842* (2013.01)

(58) Field of Classification Search
CPC ........... H01L 29/7854; H01L 29/785; H01L 29/7851; H01L 29/7855; H01L 29/7856; H01L 27/0886; H01L 27/0924
See application file for complete search history.

(56) References Cited

U.S. PATENT DOCUMENTS

| | | | |
|---|---|---|---|
| 2003/0192012 A1 | 10/2003 | Liu | |
| 2011/0266615 A1* | 11/2011 | Oyu | H01L 21/823412 257/329 |
| 2012/0231605 A1* | 9/2012 | Kim | H01L 21/76224 438/424 |
| 2013/0164924 A1* | 6/2013 | Shieh | H01L 29/7855 438/586 |
| 2014/0061780 A1 | 3/2014 | Son et al. | |
| 2014/0252486 A1 | 9/2014 | Lin et al. | |
| 2015/0357427 A1 | 12/2015 | Kim et al. | |
| 2016/0181425 A1* | 6/2016 | Bai | H01L 29/7848 438/283 |

FOREIGN PATENT DOCUMENTS

| KR | 10-2014-0006204 A | 1/2014 |
|---|---|---|
| KR | 10-2014-0111577 A | 9/2014 |

OTHER PUBLICATIONS

Decision of Refusal of Amendment dated Jul. 14, 2017 issued in Korean Patent Application No. 10-2015-0166554.
Office Action Korean Patent Application No. 10-2015-0166554 dated Dec. 7, 2016.
Notice of Allowance issued in corresponding Korean Patent Application No. 10-2015-0166554, dated Aug. 24, 2017; with English translation.
First Office Action issued in Chinese Patent Application No. 201510777698.2, dated Jul. 4, 2018 (9 pages).

* cited by examiner

SEMICONDUCTOR DEVICE AND MANUFACTURING METHOD THEREOF

TECHNICAL FIELD

The disclosure relates to a semiconductor integrated circuit, more particularly to a semiconductor device having a fin structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin structures (e.g., wrapping) utilizing the advantage of the increased surface area of the channel and source/drain regions to produce faster, more reliable and better-controlled semiconductor transistor devices. A metal gate structure together with a high-k gate dielectric having a high electric dielectric constant is often used in a Fin FET device, and is fabricated by a gate-replacement technology.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1A:
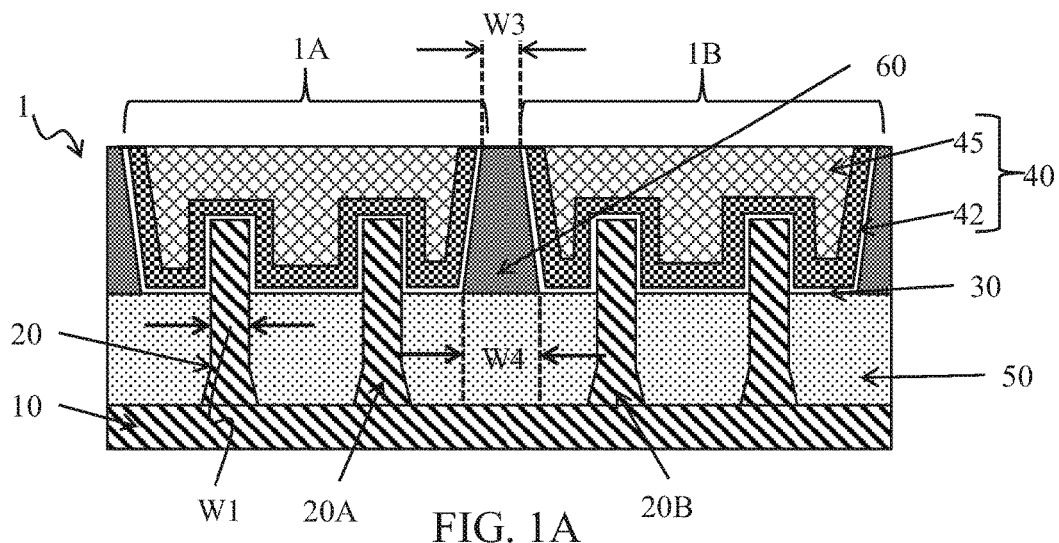
FIG. 1A is an exemplary cross sectional view of a semiconductor FET device having a fin structure (Fin FET)
Figure 1B:
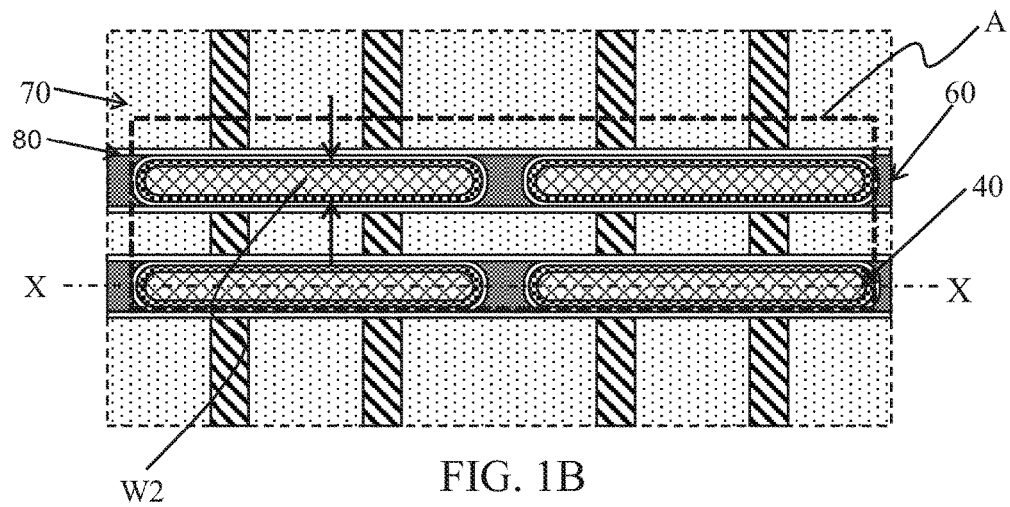
FIG. 1B is an exemplary top view of the semiconductor FET device having a fin structure.
Figure 1C:
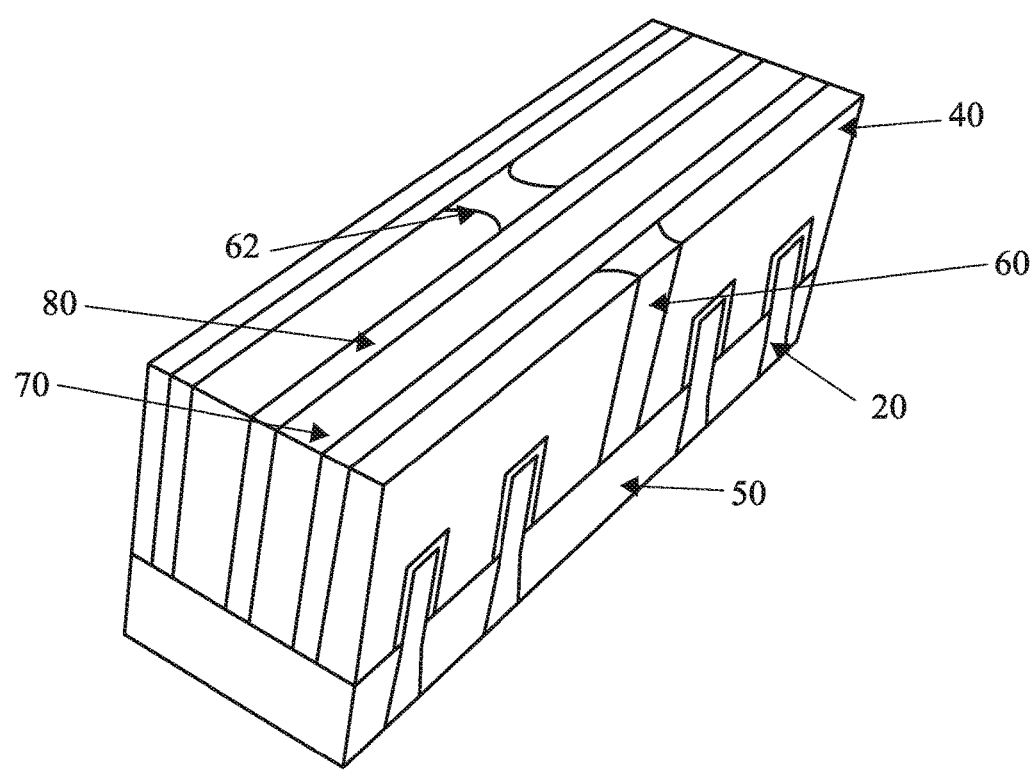
FIG. 1C is an exemplary perspective view of the semiconductor FET device having a fin structure, corresponding to the enclosed portion in FIG. 1B, according to one embodiment of the present disclosure.

FIG. 1A is an exemplary cross sectional view of a semiconductor FET device having a fin structure (Fin FET), FIG. 1B is an exemplary top view of the semiconductor FET device having a fin structure, and FIG. 1C is an exemplary perspective view of the semiconductor FET device having a fin structure according to one embodiment of the present disclosure. FIG. 1A is the cross sectional view along line X-X in FIG. 1B, and FIG. 1C corresponds to the enclosed portion A in FIG. 1B. In these figures, some layers/features are omitted for simplification. FIGS. 1A-1C show the device structure after a metal gate structure has been formed.

The Fin FET device 1 includes a first device region 1A and a second device region 1B. The first device region 1A includes one or more first Fin FET devices, and the second device region includes one or more second Fin FET devices. A channel type of the first Fin FET is the same as or different from a channel type of the second Fin FET.

In one embodiment, the first device region 1A includes p-type MOS FETs and the second device region 1B includes n-type MOS FETs. In other embodiments, the first and second device regions include p-type MOS FETs, the first and second device regions include n-type MOS FETs or the first and second device regions include both p-type and n-type MOS FETs.

The Fin FET device 1 includes, among other features, a substrate 10, fin structures 20, a gate dielectric 30 and a gate electrode 40. In this embodiment, the substrate 10 is a silicon substrate. Alternatively, the substrate 10 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. When an SOI substrate is used, the fin structure may protrude from the silicon layer of the SOI substrate or may protrude from the insulator layer of the SOI substrate. In the latter case, the silicon layer of the SOI substrate is used to form the fin structure. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The fin structure 20 is disposed over the substrate 10. The fin structure 20 may be made of the same material as the substrate 10 and may continuously extend from the substrate 10. In this embodiment, the fin structure is made of Si. The silicon layer of the fin structure 20 may be intrinsic, or appropriately doped with an n-type impurity or a p-type impurity.

In FIG. 1A, two fin structures 20 are disposed in the first device region 1A and in the second device region 1B, respectively. However, the number of the fin structures is not limited to two (or four). The numbers may be one, two, three or five or more. In addition, one of more dummy fin structures may be disposed adjacent both sides of the fin structures 20 to improve pattern fidelity in patterning processes. The width W1 of the fin structure 20 is in a range of about 5 nm to about 40 nm in some embodiments, and may be in a range of about 7 nm to about 15 nm in certain embodiments. The height of the fin structure 20 is in a range of about 100 nm to about 300 nm in some embodiments, and may be in a range of about 50 nm to 100 nm in other embodiments.

The lower part of the fin structure 20 under the gate electrode 40 is referred to as a well layer, and the upper part of the fin structure 20 is referred to as a channel layer. Under the gate electrode 40, the well layer is embedded in the isolation insulating layer 50, and the channel layer protrudes from the isolation insulating layer 50. A lower part of the channel layer may also be embedded in the isolation insulating layer 50 to a depth of about 1 nm to about 5 nm.

The height of the well layer is in a range of about 60 nm to 100 nm in some embodiments, and the height of the channel layer is in a range of about 40 nm to 60 nm.

Further, spaces between the fin structures 20 and/or a space between one fin structure and another element formed over the substrate 10 are filled by an isolation insulating layer 50 (or so-called a "shallow-trench-isolation (STI)" layer) including an insulating material, and an interlayer dielectric layer 70 disposed over the isolation insulating layer 50. The insulating material for the isolation insulating layer 50 and the interlayer dielectric layer 70 may include one or more layers of silicon oxide, silicon nitride, silicon oxynitride (SiON), SiOCN, fluorine-doped silicate glass (FSG), or a low-K dielectric material. The insulating material for the isolation insulating layer 50 may be the same as or different from that for the interlayer dielectric layer 70.

The channel layer of the fin structure 20 protruding from the isolation insulating layer 50 is covered by a gate dielectric layer 30, and the gate dielectric layer 30 is further covered by a gate electrode 40. Part of the channel layer not covered by the gate electrode 40 functions as a source and/or drain of the MOS FET (see, FIG. 1B). The fin structures 20 extend in a first direction and the gate electrodes 40 extends in a second direction perpendicular to the first direction.

In certain embodiments, the gate dielectric layer 30 includes one or more layers of dielectric materials, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 30 may include an interfacial layer made of silicon dioxide.

The gate electrode 40 includes one or more layers of any suitable materials, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In certain embodiments, the gate electrode includes a metal gate layer 45.

In certain embodiments of the present disclosure, one or more work function adjustment layers 42 may also be disposed between the gate dielectric layer 30 and the metal gate layer 45. The work function adjustment layer may include a single layer or alternatively a multi-layer structure, such as various combinations of a metal layer with a selected work function to enhance the device performance (work function metal layer), liner layer, wetting layer, adhesion layer, metal alloy or metal silicide. The work function adjustment layers are made of a conductive material such as a single layer of Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials, or a multilayer of two or more of these materials. For the n-channel Fin FET, one or more of TaN, TaAlC, TiN, TiC, Co, TiAl, HfTi, TiSi and TaSi is used as the work function adjustment layer, and for the p-channel Fin FET, one or more of TiAlC, Al, TiAl, TaN, TaAlC, TiN, TiC and Co is used as the work function adjustment layer. In some embodiments, the work function adjustment layer may include a first metal material for the p-channel Fin FET (e.g., in the first device region 1A) and a second metal material for the n-channel Fin FET (e.g., in the second device region 1B). For example, the first metal material for the n-channel Fin FET may include metals having a work function substantially aligned with a work function of the substrate conduction band, or at least substantially aligned with a work function of the conduction band of the channel layer of the fin structure 20. Similarly, for example, the second metal material for the p-channel Fin FET may include metals having a work function substantially aligned with a work function of the substrate valence band, or at least substantially aligned with a work function of the valence band of the channel layer of the fin structure 20. In some embodiments, the work function adjustment layer may alternately include a polysilicon layer. The work function adjustment layer may be formed by ALD (atomic layer deposition), PVD, CVD, e-beam evaporation, or other suitable process. Further, the work function adjustment layer may be formed separately for the n-channel Fin FET and the p-channel Fin FET which may use different metal layers.

Source and drain regions are also formed in the fin structure not covered by the gate electrode 40, by appropriately doping impurities in the source and drain regions. An alloy of Si or Ge and a metal such as Co, Ni, W, Ti or Ta may be formed on the source and drain regions 25. Si and/or SiGe layers may be epitaxially formed in the source-drain regions to form a raised source-drain structure and to apply appropriate stresses to the channel layer.

Further, side-wall insulating layers 80 are disposed at both sides of the gate electrode 40. The gate electrode 40 and the source/drain regions are covered by the interlayer dielectric layer 70, and necessary wirings and/or via/contact holes are disposed so as to complete the semiconductor device.

The width W2 of the gate electrode 40 including the work function adjusting layer 42 and the metal gate layer 45 is in a range of about 20 nm to 40 nm in some embodiments. When plural gate electrodes 40 are arranged in the width direction (see, FIG. 1B), a pitch of the gate electrodes is in a range of about 60 nm to 100 nm in some embodiments.

As shown in FIGS. 1A-1C, adjacent gate electrodes 40 are separated from each other by a separation plug 60 made of an insulating material. In the cross section shown in FIG. 1A, the separation plug 60 has a tapered shape having a smaller top size (width) and a larger bottom size (width). The width W3 at the top of the separation plug is less than about 20 nm in certain embodiments and may be in a range of about 5 nm to about 15 nm in some embodiments. The width W4 at the bottom of the separation plug is less than about 35 nm in certain embodiments and may be in a range of about 10 nm to about 30 nm in some embodiments. Here, the top of the separation plug corresponds to the upper surface of the gate electrode 40 and the bottom of the separation plug 60 corresponds to the bottom of the gate dielectric layer 30 or the interface between the isolation insulating layer 50 and the interlayer dielectric layer 70. The insulating material for the separation plug 60 may include silicon oxide, silicon nitride, silicon oxynitride (SiON), SiOCN, fluorine-doped silicate glass (FSG), or a low-K dielectric material.

The insulating material for the separation plug 60 may be the same as or may be different from an insulating material for the isolation insulating layer 50 and/or the interlayer dielectric layer 70.

FIGS. 2-12E show cross sectional views of exemplary sequential processes of manufacturing the Fin FET device according to one embodiment of the present disclosure. It is understood that additional operations can be provided before, during, and after processes shown by FIGS. 2-12E, and some of the operations described below can be replaced or eliminated, for additional embodiments of the method. The order of the operations/processes may be interchangeable. Further, the general operations for manufacturing a metal gate structure over the fin structure by gate replacement technologies are disclosed in U.S. Patent Publication No. 2013/0161762, the entire contents of which are incorporated herein by reference.

To fabricate a fin structure, a mask layer is formed over the substrate 10 by, for example, a thermal oxidation process and/or a chemical vapor deposition (CVD) process. The substrate 10 is, for example, a p-type silicon substrate with an impurity concentration being in a range of about $1\times10^{15}$ $cm^{-3}$ and about $1\times10^{18}$ $cm^{-3}$. In other embodiments, The substrate 10 is an n-type silicon substrate with an impurity concentration being in a range of about $1\times10^{15}$ $cm^{-3}$ and about $1\times10^{18}$ $cm^{-3}$. The mask layer includes, for example, a pad oxide (e.g., silicon oxide) layer and a silicon nitride mask layer in some embodiments.

The pad oxide layer may be formed by using thermal oxidation or a CVD process. The silicon nitride mask layer may be formed by a physical vapor deposition (PVD), such as sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The thickness of the pad oxide layer is in a range of about 2 nm to about 15 nm and the thickness of the silicon nitride mask layer is in a range of about 2 nm to about 50 nm in some embodiments. A mask pattern is further formed over the mask layer. The mask pattern is, for example, a photo resist pattern formed by photo lithography.

By using the mask pattern as an etching mask, a hard mask pattern 100 of the pad oxide layer 106 and the silicon nitride mask layer 107 is formed. The width of the hard mask pattern is in a range of about 5 nm to about 40 nm in some embodiments. In certain embodiments, the width of the hard mask pattern is in a range of about 7 nm to about 12 nm.

Figure 2:
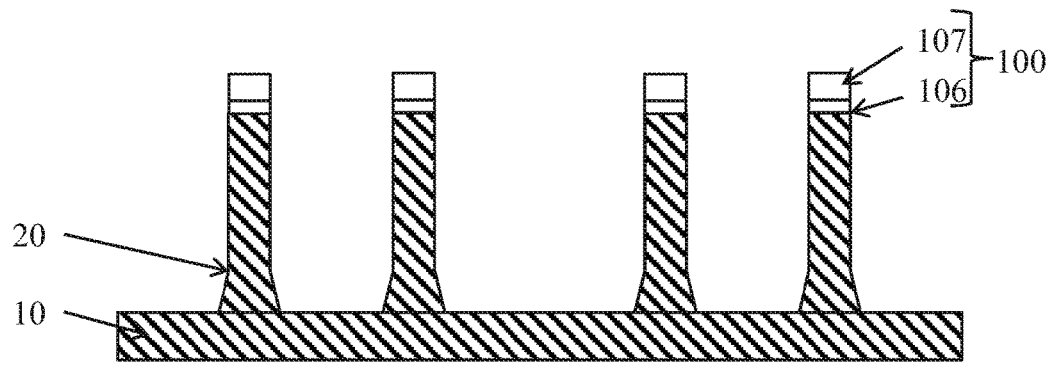
FIGS. 2-12C show exemplary processes for manufacturing the Fin FET device according to one embodiment of the present disclosure.

As shown in FIG. 2, by using the hard mask pattern as an etching mask, the substrate 10 is patterned into fin structures 20 by trench etching using a dry etching method and/or a wet etching method. A height of the fin structure 20 is in a range of about 100 nm to about 300 nm. In certain embodiments, the height is in a range of about 50 nm to about 100 nm. When the heights of the fin structures are not uniform, the height from the substrate may be measured from the plane that corresponds to the average heights of the fin structures.

In this embodiment, a bulk silicon wafer is used as a starting material and constitutes the substrate 10. However, in some embodiments, other types of substrates may be used as the substrate 10. For example, a silicon-on-insulator (SOI) wafer may be used as a starting material, and the insulator layer of the SOI wafer constitutes the substrate 10 and the silicon layer of the SOI wafer is used for the fin structure 20.

Figure 3:
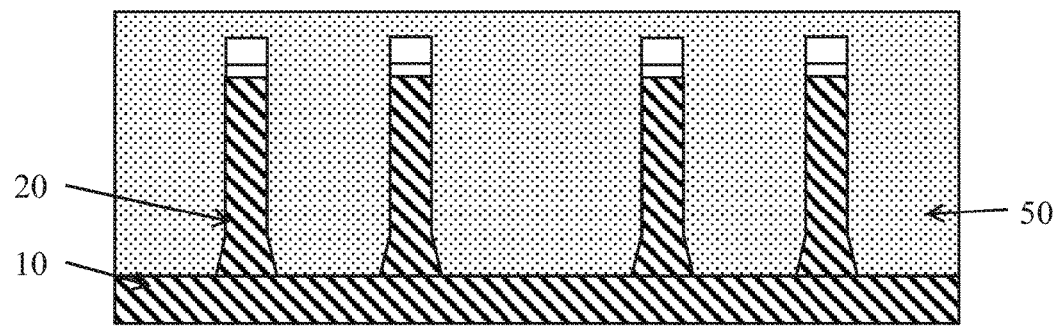

As shown in FIG. 3, an isolation insulating layer 50 is formed over the substrate 10 so as to fully cover the fin structure 20.

The isolation insulating layer 50 includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydropolysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. The flowable film may be doped with boron and/or phosphorous. The isolation insulating layer 50 may be formed by one or more layers of SOG, SiO, SiON, SiOCN and/or fluoride-doped silicate glass (FSG) in some embodiments.

Figure 4:
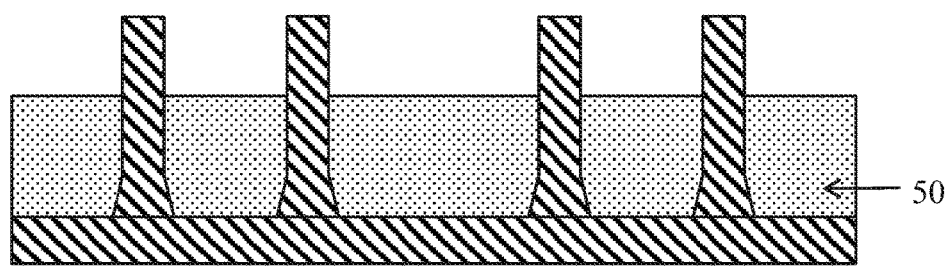

After forming the isolation insulating layer 50, a planarization operation is performed so as to remove part of the isolation insulating layer 50 and the mask layer 100 including the pad oxide layer 106 and the silicon nitride mask layer 107. Then, the isolation insulating layer 50 is further removed so that an upper part of the fin structure 20, which is to become a channel layer, is exposed, as shown in FIG. 4.

After forming the isolation insulating layer 50, a thermal process, for example, an anneal process, may be performed to improve the quality of the isolation insulating layer 50. In certain embodiments, the thermal process is performed by using rapid thermal annealing (RTA) at a temperature in a range of about 900° C. to about 1050° C. for about 1.5 seconds to about 10 seconds in inert gas ambient, for example, $N_2$, Ar or He ambient.

A gate oxide layer 105 and a poly silicon layer are formed over the isolation insulating layer 50 and the exposed fin structures 20, and then patterning operations are performed so as to obtain a poly gate layer 110 made of poly silicon. The gate oxide layer 105 may be silicon oxide formed by CVD, PVD, ALD, e-beam evaporation, or other suitable process. A thickness of the poly silicon layer is in a range of about 5 to about 100 nm in some embodiments. The poly gate layer 110 and the gate oxide layer 105 are dummy layers which are eventually removed in a gate-replacement technology.

Side-wall insulating layers 80 are also formed at both sides of the poly gate layer 110.

Figure 5A:
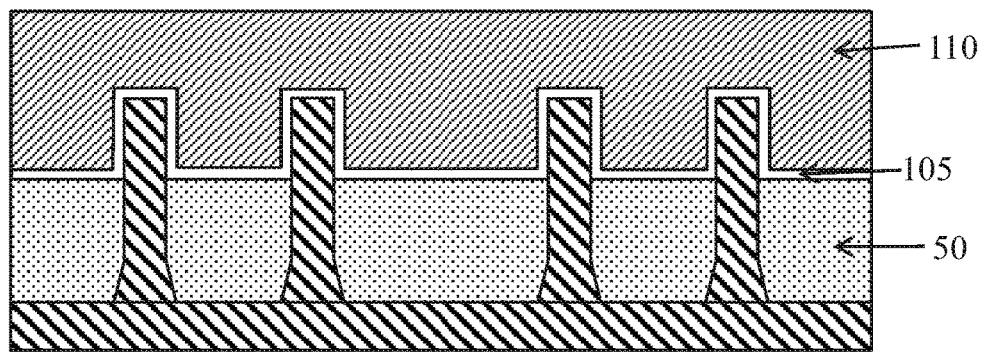
Figure 5B:
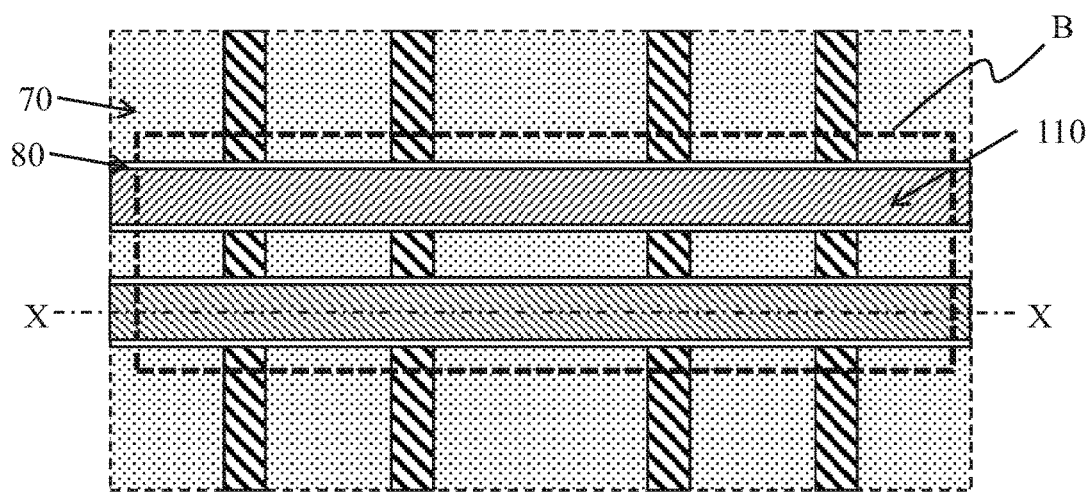
Figure 5C:
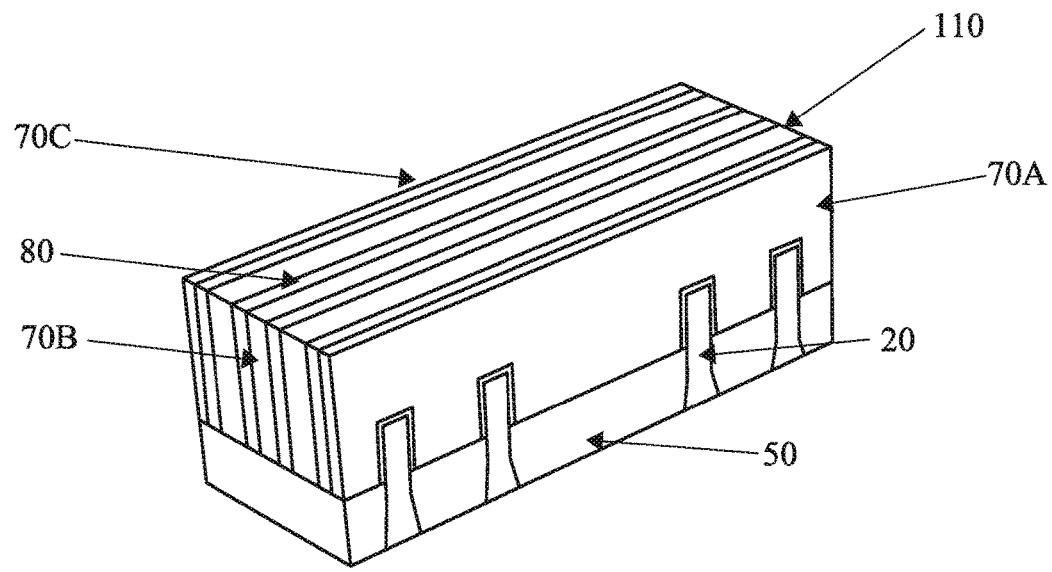

Further, an interlayer dielectric layer 70 is formed in spaces between the poly gate layers 110, the side-wall insulating layers 80 and over the poly gate layer 110. Planarization operations, such as an etch back process and/or a chemical mechanical polishing (CMP) process, are performed, so as to obtain the structure shown in FIGS. 5A-5C. FIG. 5A is a cross sectional view, FIG. 5B is a top view, and FIG. 5C is a perspective view of the Fin FET device after the poly gate layer 110 and the interlayer dielectric layer 70 are formed. FIG. 5A is the cross sectional view along line X-X in FIG. 5B, and FIG. 5C corresponds to the enclosed portion B in FIG. 5B.

As shown in FIGS. 5B and 5C, in certain embodiments, the poly gate layers 110 are formed in a line-and-space arrangement extending in one direction with a constant pitch. The poly gate layer 110 may include another line-and-space arrangement extending in another direction perpendicular to the one direction.

Figure 6:
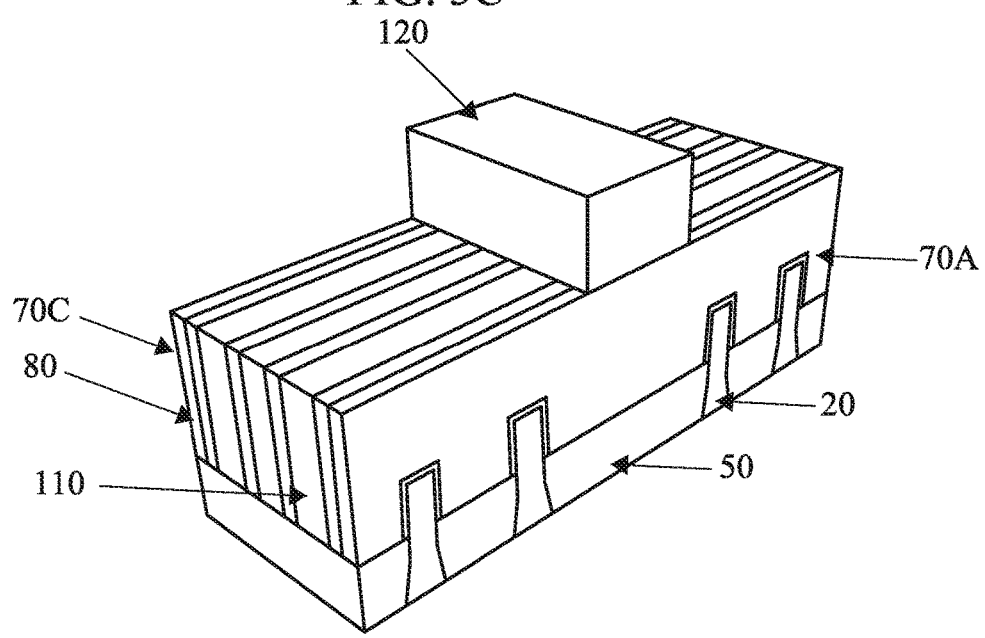

As shown in FIG. 6, a mask pattern 120 is formed over the structure shown in FIG. 5C. The mask pattern 120 is formed by, for example, a photo resist layer. The width of the mask pattern 120 as formed is in a range of about 20 nm to about 120 nm in some embodiments, and may be in a range of about 40 nm to about 60 nm in other embodiments.

Instead of a photo resist layer, the mask layer 120 may be a hard mask formed by a material that has a high etching resistivity during poly silicon etching in some embodiments. The hard mask material includes silicon oxide, silicon oxynitride or silicon nitride or meal materials.

Figure 7:
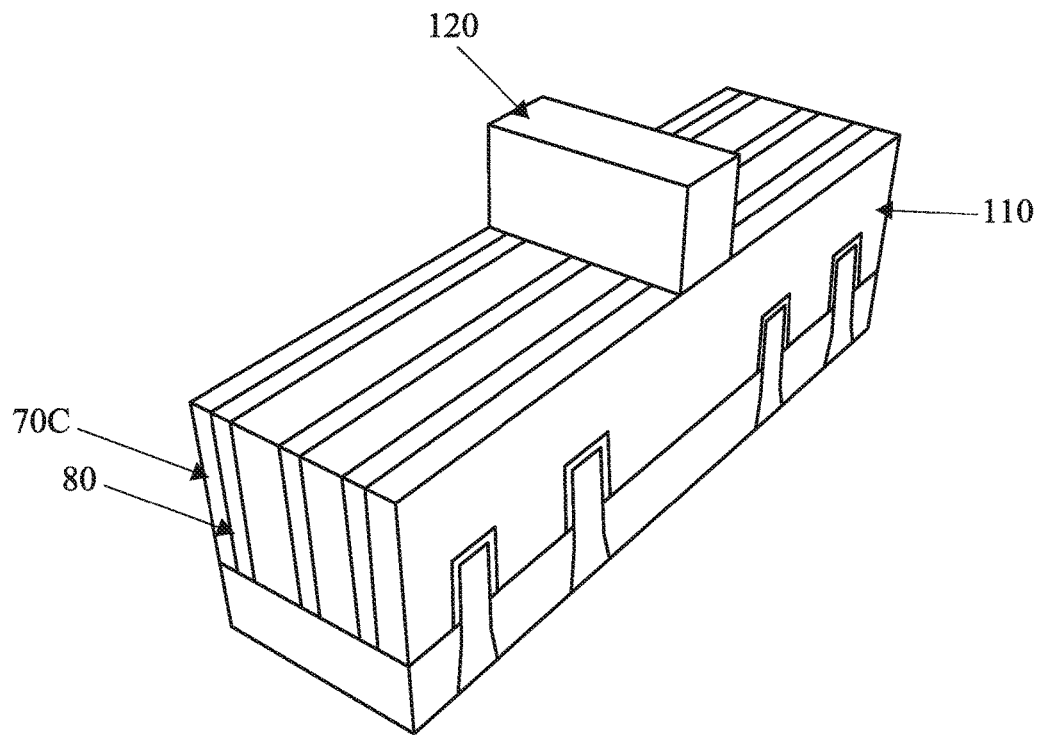

As shown in FIG. 7, the width of the mask pattern 120 is reduced by using a dry etch operation to obtain a desirable width. After the dry etching, the width of the mask pattern 120 is in a range of about 5 nm to about 100 nm in some embodiments, and may be in a range of about 10 nm to about 30 nm in other embodiments. Instead of reducing the width of the mask pattern, it is possible to directly form a mask pattern 120 having a desirable width.

Figure 8:
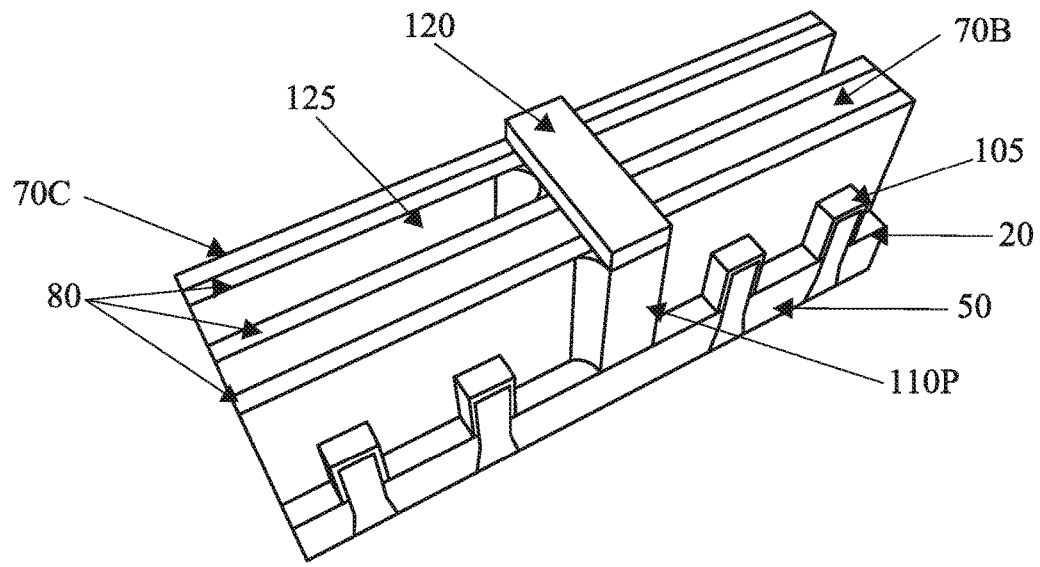

As shown in FIG. 8, by using the mask pattern 120, a part of poly gate layer 110 is etched, thereby forming a space 125. In FIG. 8 and thereafter, one layer 70A of the interlayer dielectric layers 70 is omitted to illustrate the etched poly gate layer 110 and the space 125, while other layers 70B and 70C are still shown. The etching of the poly gate layer is performed by plasma etching using gases including $CH_4$, $CF_4$, $CH_2F_2$, $CHF_3$, $O_2$, HBr, $Cl_2$, $NF_3$, $N_2$ and/or He under the pressure of 3 to 20 mTorr, in some embodiments. By removing a part of the poly gate layer 110, a poly pillar 110P is formed between the spaces 125.

Figure 9A:
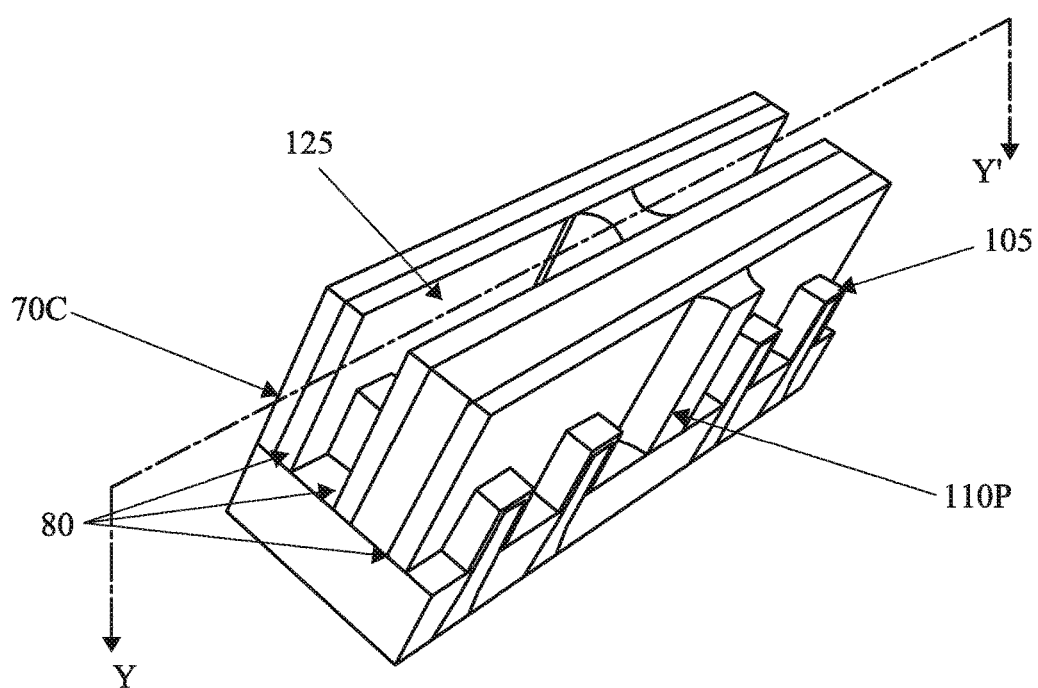

As shown in FIG. 9A, the mask pattern 120 (e.g., photo resist pattern) is removed by an ashing process and/or a wet cleaning process.

Figure 9B:
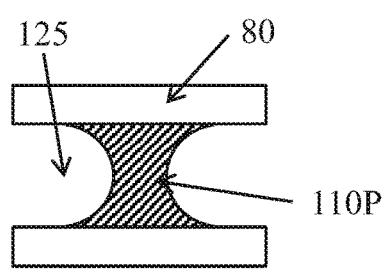

In the poly silicon etching shown in FIG. 8, an etching rate at the center of the poly gate layer 110 is relatively higher than an etching rate at an interface between the poly gate layer 110 and the side-wall insulating layers 80. Accordingly, the end shape of the poly pillar viewed from above has a concave curved shape as shown in FIG. 9B. In other words, the space 125 has a convex curved shape at the poly pillar 110P.

Figure 9C:
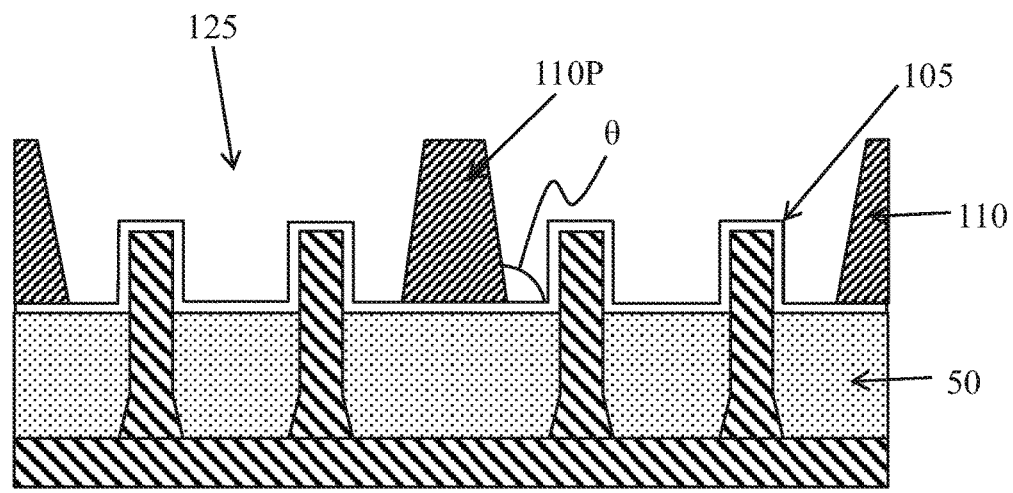

Further, the poly pillar 110P after the poly silicon etching has a tapered shape as shown in FIG. 9C, which is a cross sectional view along line Y-Y' of FIG. 9A. A taper angle θ at the bottom of the poly pillar 110P measured with respect to the surface of the isolation insulating layer 50 (or the surface of the gate oxide layer 105 disposed between the fin structures) is 90 degrees or more, and may be in a range of about 93 to about 100 degrees in certain embodiments. In some embodiments, an additional etching operation may be performed after the poly silicon etching to adjust the shape/taper angle of the poly pillar 110P.

Figure 10:
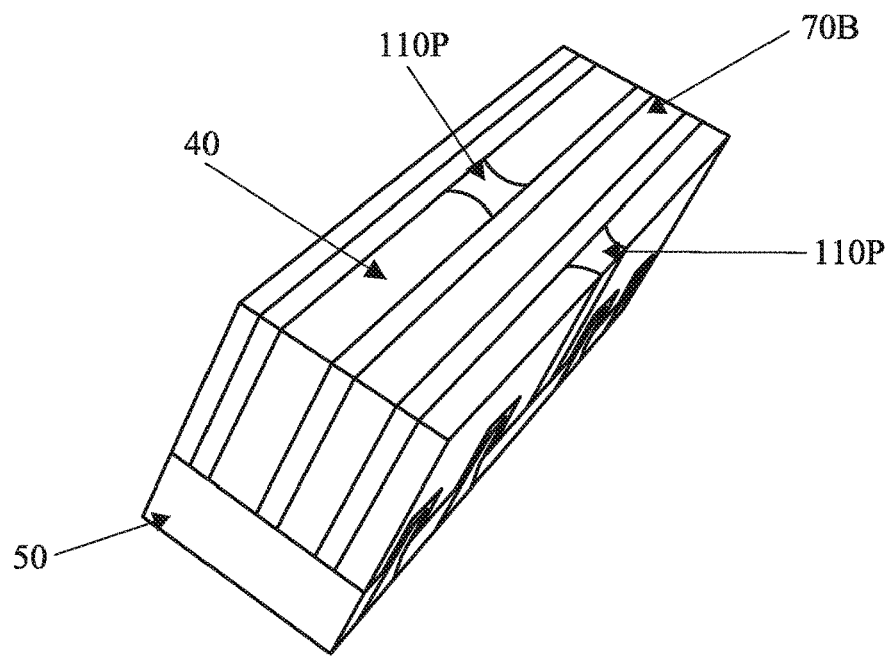

As shown in FIG. 10, a metal gate structure including a metal gate electrode 40 and a gate dielectric layer 30 (not shown in FIG. 10) is formed in the space 125 between the poly gate pillars 110P. The gate dielectric layer 30 is formed by CVD, ALD or other suitable film formation methods. The metal gate electrode 40 is formed by CVD, PVD (including sputtering), ALD, electro-plating, or other suitable metal film formation methods. Since the space 125 has a convex curved shape at the ends thereof, a metal material for the metal gate electrode 40 can be filled in the space 125 without forming a void or a seam.

Figure 11:
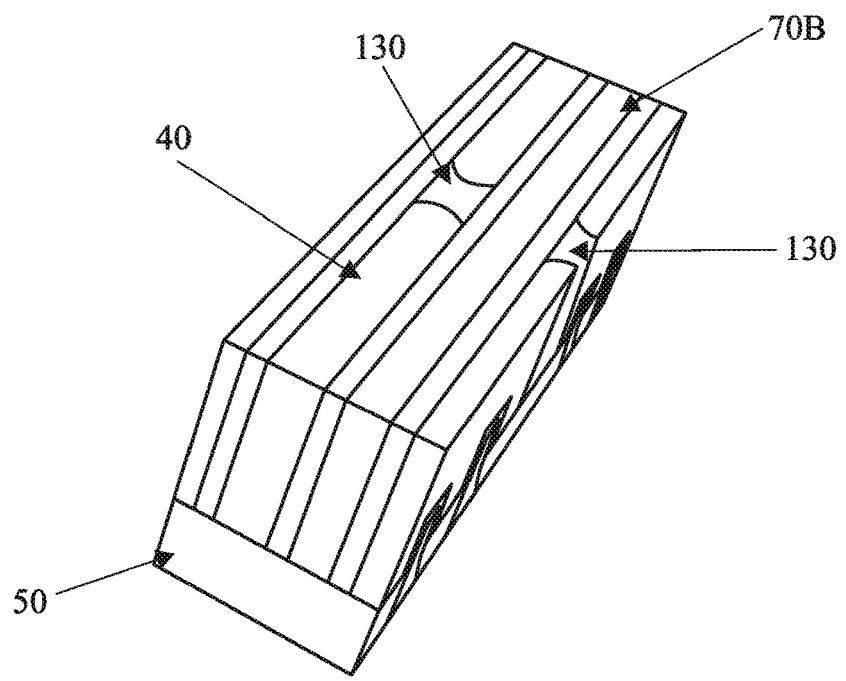

As shown in FIG. 11, the poly pillar 110P is removed by an etching operation, thereby forming an opening 130. The etching operation may include dry etching and/or wet etching.

After removing the poly pillar 110P, an insulating material is formed over the structure shown in FIG. 11, by using, for example, a CVD process, and the opening 130 is filled with the insulating material. The CVD process may include a LPCVD process, a plasma CVD process and/or a Flowable CVD process. In the Flowable CVD process, gases including $SiH_4$, $NH_3$, $N_2$, $O_2$, $N_2O$, $Cl_2$ and/or $NO_2$ may be used and the deposition is performed at a temperature in a range about 200° C. to about 1000° C., in some embodiments.

Figure 12A:
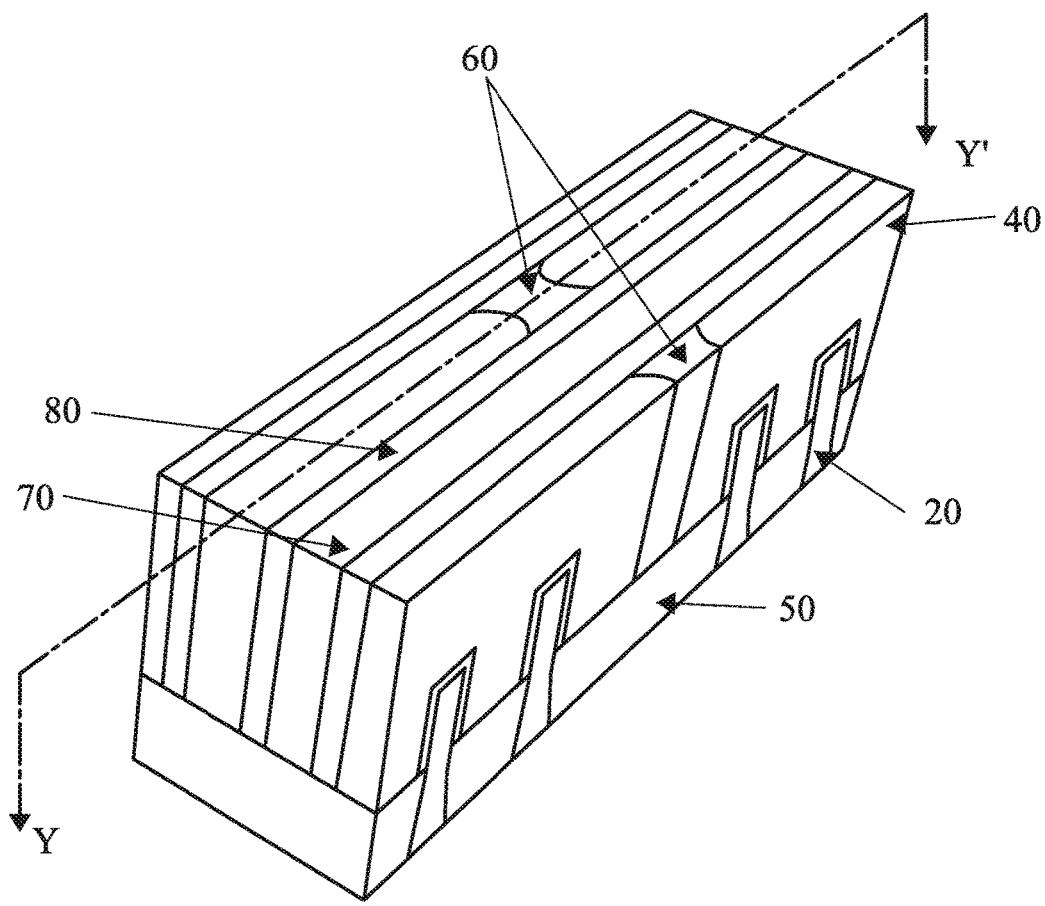
Figure 12B:
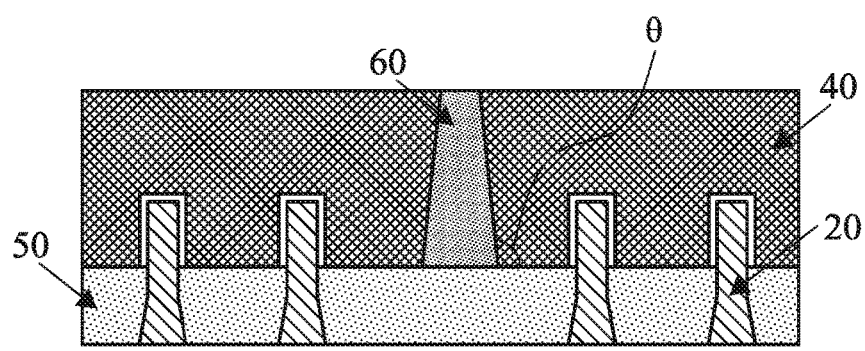
Figure 12C:
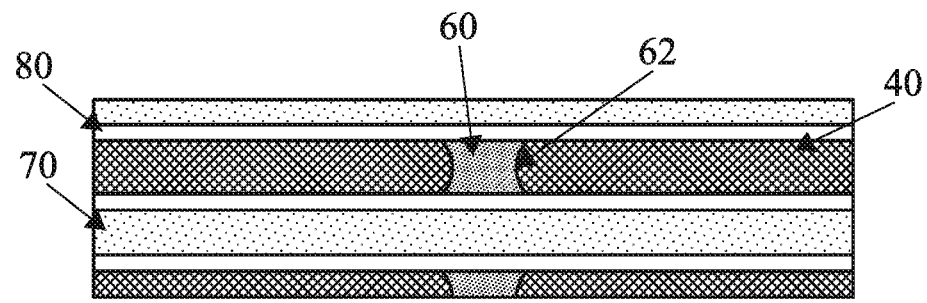

After the portion of the insulating material formed over the metal gate electrodes 40, the side-wall insulating layers 80 and the interlayer dielectric layers 70 is removed by planarization operations, separation plugs 60 are obtained, as shown in FIGS. 12A-12C. The planarization operations may include a CMP and/or an etch-back process. FIG. 12A is an exemplary perspective view, FIG. 12B is an exemplary cross sectional view along line Y-Y' of FIG. 12A, and FIG. 12C is an exemplary top view, after the separation plugs 60 are formed.

As shown in FIGS. 12A and 12C, the end shape 62 of the separation plugs 60 viewed from above has a concave curved shape, while the end of the metal gate electrode 40 has a convex curved shape. The separation plug 60 has a tapered shape as shown in FIG. 12B, and a taper angle θ at the bottom of the separation plug 60 measured with respect to the surface of the isolation insulating layer 50 (or the surface of the gate oxide layer 105 disposed between the fin structures) is 90 degrees or more. In some embodiments, the taper angle θ is in a range of about 93 to about 100 degrees.

It is understood that the Fin FETs may undergo further CMOS processes to form various features such as contacts/vias, interconnect metal layers, dielectric layers, passivation layers, etc.

Further, the aforementioned gate replacement technologies may be applied to planar type FETs.

Figure 13A:
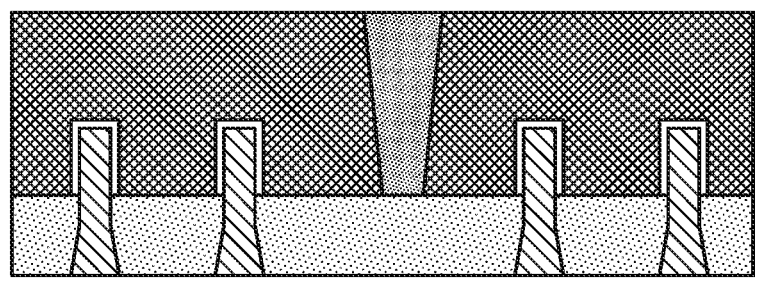
FIGS. 13A and 13B show a comparative example of a Fin FET device.
Figure 13B:
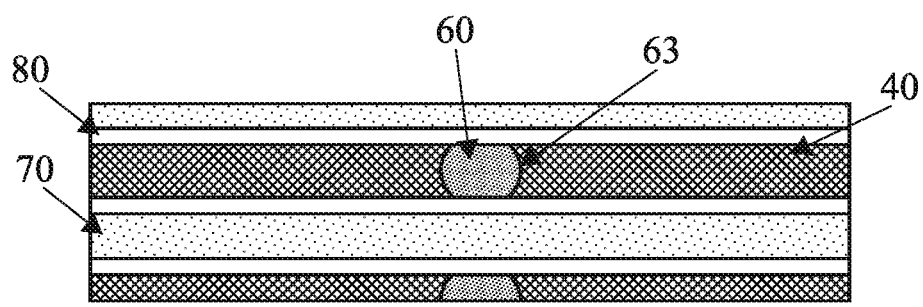

The various embodiments or examples described herein offer several advantages over the existing art. As explained above, in the present disclosure, the separation plug is formed after the metal gate electrode 40 is formed. The end of the metal gate electrode 40 has a convex curved shape toward the separation plug 60, and the separation plug 60 has a tapered shape. In contrast, when the separation plug is formed before forming the metal gate electrode, the shape of the separation plug would be a reverse tapered as shown in FIG. 13A, and the ends of the separation plug would have a convex shape as shown in FIG. 13B. In such a case, when the metal material for the metal gate electrode is formed, a void or a seam would occur near the separation plug.

However, as set forth above, in the present techniques shown in FIGS. 1-12C, a metal material for the metal gate electrode 40 can be filled in the space 125 without forming a void or a seam.

It will be understood that not all advantages have been necessarily discussed herein, no particular advantage is required for all embodiments or examples, and other embodiments or examples may offer different advantages.

In accordance with one aspect of the present disclosure, a semiconductor device includes first and second Fin FETs and a separation plug made of an insulating material and disposed between the first and second Fin FETs. The first Fin FET includes a first fin structure extending in a first direction, a first gate dielectric formed over the first fin structure and a first gate electrode formed over the first gate dielectric and extending in a second direction perpendicular to the first direction. The second Fin FET includes a second fin structure, a second gate dielectric formed over the second fin structure and a second gate electrode formed over the first gate dielectric and extending in the second direction. When viewed from above, an end shape the separation plug has a concave curved shape, while an end of the first gate electrode abutting the separation plug has a convex curved shape.

In accordance with another aspect of the present disclosure, in a method for manufacturing a semiconductor device, a dummy electrode structure and interlayer dielectric layers are formed. The dummy electrode structure includes a dummy gate electrode layer and side-wall insulating layer disposed at both main sides of the dummy gate electrode layer. The interlayer dielectric layers are disposed at both main sides of the dummy electrode layer. Part of the dummy gate electrode layer is removed so that a first space and a second space are formed between the side-wall insulating layers. The first electrode space and the second electrode space are separated by a pillar that is a remaining part of the dummy gate electrode layer. A first gate structure and a second gate structure are formed in the first electrode space and the second electrode space, respectively. The pillar is removed so that an opening is formed between the first gate structure and the second gate structure. A separation plug is formed by filling the opening with an insulating material.

In accordance with another aspect of the present disclosure, a semiconductor device includes an FET including a first gate dielectric layer and a metal gate electrode, and a separation plug made of an insulating material and disposed adjacent to the FET. When viewed from above, an end shape the separation plug has a concave curved shape, while an end of the metal gate electrode abutting the separation plug has a convex curved shape.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first Fin FET including a first fin structure extending in a first direction, a first gate dielectric formed over the first fin structure and a first gate electrode formed over the first gate dielectric and extending in a second direction perpendicular to the first direction;
    a second Fin FET including a second fin structure extending in the first direction, a second gate dielectric formed over the second fin structure and a second gate electrode formed over the first gate dielectric and extending in the second direction; and
    a separation plug made of an insulating material and disposed between the first Fin FET and the second FinFET,
    wherein when viewed from above, an end shape the separation plug has a concave curved shape, while an end of the first gate electrode abutting the separation plug has a convex curved shape.

2. The semiconductor device of claim 1, wherein in a cross section along the second direction and across the first gate electrode, the separation plug has a tapered shape having a top width smaller than a bottom width.

3. The semiconductor device of claim 2, further comprising an isolation insulating layer disposed at least between the first fin structure and the second fin structure, wherein:
    the separation plug is disposed over the isolation insulating layer, and
    a taper angle of the separation plug at a bottom of the separation plug measured with respect to a surface of the isolation insulating layer is 90 degrees or more.

4. The semiconductor device of claim 1, wherein:
    the first gate electrode includes a first metal gate material, and
    the second gate electrode includes a second metal gate material.

5. The semiconductor device of claim 4, wherein:
    the first gate electrode further includes one or more layers of first work function adjusting metals disposed between the first gate dielectric layer and the first metal gate material, and
    the second gate electrode further includes one or more layers of second work function adjusting metals disposed between the second gate dielectric layer and the second metal gate material.

6. The semiconductor device of claim 1, wherein the first Fin FET and the second Fin FET have a same channel type.

7. The semiconductor device of claim 1, wherein a channel type of the first Fin FET is different from a channel type of the second Fin FET.

8. The semiconductor device of claim 1, wherein two or more first fin structures are included in the first Fin FET.

9. The semiconductor device of claim 1, further comprising side-wall insulating layers disposed on opposite sides of the first and second gate electrode and on opposite sides of the separation plug.

10. The semiconductor device of claim 9, wherein a material of the separation plug is different from a material of the side-wall insulating layers.

11. The semiconductor device of claim 9, further comprising interlayer dielectric layers disposed on the side-wall insulating layers.

12. The semiconductor device of claim 11, wherein a material of the separation plug is different from a material of the interlayer dielectric layers.

13. The semiconductor device of claim 3, wherein a material of the separation plug is different from a material of the isolation insulating layer.

14. A semiconductor device, comprising:
a first Fin FET including:
   a first fin structure extending in a first direction;
   a first gate dielectric formed over the first fin structure;
   a first gate electrode formed over the first gate dielectric and extending in a second direction perpendicular to the first direction; and
   first side-wall insulating layers disposed on opposite sides of the first gate electrode;
a second Fin FET including:
   a second fin structure extending in the first direction;
   a second gate dielectric formed over the second fin structure;
   a second gate electrode formed over the first gate dielectric and extending in the second direction; and
   second side-wall insulating layers disposed on opposite sides of the second gate electrode; and
a separation plug made of an insulating material and disposed between the first Fin FET and the second FinFET, wherein:
when viewed from above, an end shape the separation plug has a concave curved shape, while an end of the first gate electrode abutting the separation plug has a convex curved shape,
the first side-wall insulating layers and the second side-wall insulating layers are continuously formed as a side-wall insulating layers so that the side-wall insulating layers are disposed on opposite sides of the separation plug, and
a material of the separation plug is different from a material of the side-wall insulating layers.

15. A semiconductor device, comprising:
a Fin FET including a gate dielectric layer and a metal gate electrode extending in a first direction; and
an insulating plug made of an insulating material and disposed adjacent to the Fin FET,
wherein when viewed from above, an end shape of the insulating plug has a concave curved shape and the insulating plug has a flat portion, while an end of the metal gate electrode abutting the insulating plug has a convex curved shape,
a width of the insulating plug along the first direction decreases from one end portion in a second direction crossing the first direction and then increases to another end portion,
the Fin FET includes a fin structure, a bottom portion of which is embedded in an isolation insulating layer and an upper portion of which protrudes from the isolation insulating layer, and
the insulating plug is disposed over the isolation insulating layer.

16. The semiconductor device of claim 15, wherein in a cross section along an extending direction of the metal gate electrode, the insulating plug has a tapered shape having a top width smaller than a bottom width.

17. The semiconductor device of claim 16, wherein:
a taper angle of the insulating plug at a bottom of the insulating plug measured with respect to a surface of the isolation insulating layer is 90 degrees or more.

18. The semiconductor device of claim 17, wherein two or more fin structures are included in the Fin FET.

19. The semiconductor device of claim 17, wherein a material of the insulating plug is different from a material of the isolation insulating layer.

20. The semiconductor device of claim 16, wherein:
the Fin FET further includes one or more layers of first work function adjusting metals disposed between the gate dielectric layer and the metal gate electrode.

* * * * *